United States Patent
Mangyo et al.

(10) Patent No.: US 6,715,117 B2
(45) Date of Patent: Mar. 30, 2004

(54) METHOD OF TESTING A SEMICONDUCTOR MEMORY DEVICE

(75) Inventors: Atsuo Mangyo, Tokyo (JP); Manabu Miura, Tokyo (JP); Makoto Hatakenaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 444 days.

(21) Appl. No.: 09/761,847

(22) Filed: Jan. 18, 2001

(65) Prior Publication Data

US 2002/0048856 A1 Apr. 25, 2002

(30) Foreign Application Priority Data

Sep. 18, 2000 (JP) .......................... 2000-282413

(51) Int. Cl.[7] ............................................. G11C 29/00
(52) U.S. Cl. ...................................................... 714/719
(58) Field of Search ................................ 714/718, 719, 714/730, 735, 743, 819; 365/201

(56) References Cited

U.S. PATENT DOCUMENTS

| | | | | |
|---|---|---|---|---|
| 5,428,575 A | * | 6/1995 | Fudeyasu | 365/201 |
| 5,434,868 A | * | 7/1995 | Aichelmann et al. | 714/718 |
| 5,469,443 A | * | 11/1995 | Saxena | 714/720 |
| 5,485,425 A | * | 1/1996 | Iwai et al. | 365/200 |
| 5,523,980 A | * | 6/1996 | Sakui et al. | 365/230.08 |
| 5,917,764 A | * | 6/1999 | Ohsawa et al. | 365/200 |
| 5,991,218 A | * | 11/1999 | Kushiyama | 365/222 |
| 6,009,548 A | * | 12/1999 | Chen et al. | 714/762 |
| 6,049,898 A | * | 4/2000 | Sugiyama et al. | 714/718 |
| 6,092,227 A | * | 7/2000 | Toki et al. | 714/736 |
| 6,175,937 B1 | * | 1/2001 | Norman et al. | 714/718 |
| 6,279,129 B1 | * | 8/2001 | McConnell et al. | 714/718 |
| 6,381,715 B1 | * | 4/2002 | Bauman et al. | 714/718 |

FOREIGN PATENT DOCUMENTS

| | | |
|---|---|---|
| JP | 06-012894 A | 1/1994 |
| JP | 11-149797 | 6/1999 |
| JP | 11-250698 A | 9/1999 |

* cited by examiner

Primary Examiner—Albert Decady
Assistant Examiner—Matthew C. Dooley
(74) Attorney, Agent, or Firm—Burns, Doane, Swecker & Mathis, L.L.P.

(57) ABSTRACT

A method for testing a semiconductor memory device according to one embodiment comprises the steps of: checking data in all addresses of the semiconductor memory device for correctness in-units of m×n bits: ending if it is determined that data in all the semiconductor memory device; if there is a defective address, comparing each m-bit data constituting the (m×n)-bit data corresponding to the defective address with its expected value; and if the comparison result indicates that the m-bit data is erroneous, determining whether the defective semiconductor memory device can be repaired. Due to this step, man hours required for testing a semiconductor memory device having a wide data bus of an (m×n)-bit width can be considerably reduced.

12 Claims, 11 Drawing Sheets

METHOD OF TESTING A SEMICONDUCTOR MEMORY DEVICE

BACKGROUND OF THE INVENTION

1. Field of the Invention

The present invention relates to a method for testing a semiconductor memory device, and more particularly to a method for testing a semiconductor memory device by use of a test circuit having, for example, the semiconductor memory device to be tested and logic circuits mounted thereon.

2. Description of the Related Art

FIG. 10 is a circuit diagram showing the configuration of a test circuit employed by a conventional method for testing a semiconductor memory device.

In the figure, reference numeral 5 denotes a test circuit for testing a DRAM 52 having a capacity of 16 Mbits, and the test circuit 5 is connected to a testing device (hereinafter referred to as a tester) not shown. Reference numeral 51 denotes an 8-bit D flip-flop which receives 8-bit input data TDI output from the tester through its input D (7:0) and holds the data upon a rise of a write clock signal TWCK. The output Q (7:0) of the 8-bit D flip-fop 51 is controlled according to an output control signal TOE-.

Reference numeral 52 indicates a 16 Mbit DRAM (Dynamic Random Access Memory) used as a semiconductor memory device sample to be tested, and has a wide data bus of, for, example, an (m×n)-bit width—in the example of FIG. 10, m=8 (bits) and n=16 (stages), totaling 128 bits. There are 4096 row addresses and 32 column addresses, that is, a 12-bit row address line and a 5-bit column address line, respectively, totaling 17 bits for the row and column address lines.

Reference numeral 53 denotes a 128-to-8 multiplexer which reads (8×16)-bit data from the 16 Mbit DRAM 52, selects a set of an 8-bit data from the read (8×16)-bit data based on an output data selection signal TSEL fed from the tester, and outputs the selected 8-bit data as an 8-bit output data TDO.

The number 4, 8, or 17 given to each line indicates the number of data bits employed for the line, and the bracketed numbers <0> to <15> each indicate corresponding an 8-bit data.

The operation of the test circuit will be explained below.

Description will be first made of write operation to the 16 Mbit DRAM 52.

The input data TDI output from the tester is input to the input D (7:0) of the D flip-flop 51, and held upon a rise of a write clock signal TWCK. At that time, when the tester outputs an output control signal TOE- having a high level (H level signal) so as to apply the H level signal to the OE terminal of the D flip-flop 51, an 8-bit data is output from the output Q (7:0) of the D flip-flop 51.

The data output from the output Q (7:0) of the D flip-flop 51 branches out into 16 sets of data each having 8 bits. Then, the tester enters an address signal TADI, which indicates a row address and a column address, and an address strobe signal TAS- having a low level (an L level), to the corresponding terminals of the 16 Mbit DRAM 52. The current address signal TADI is introduced into the 16 Mbit DRAM 52 at a timing according to the address strobe signal TAS-. With the timing of introduction of the address signal TADI into the 16 Mbit DRAM 52, the tester outputs a write control signal TW- having an L level, and as result, the data which has branched out into the 16 sets of data each having 8 bits is written into a memory area in the 16 Mbit DRAM 52 specified by the address signal TADI through a terminal D (127:0). At that time, since an output control signal TOE- having an H level is fed to the 16 Mbit DRAM 52, the output of the 16 Mbit DRAM 52 is disabled.

Next, description will be made of read operation from the 16 Mbit DRAM 52.

The tester enters an address signal TADI, which indicates a row address and a column address, and an address strobe signal TAS- having an L level, to the corresponding terminals of the 16 Mbit DRAM 52. The current address signal TADI is introduced into the 16 Mbit DRAM 52 at a timing according to the address strobe signal TAS-. With the timing of introduction of the address signal TADI into the 16 Mbit DRAM 52, the tester outputs an output control signal TOE- having an L level, and as result, (8×16)-bit data which has been written into a memory area in the 16 Mbit DRAM 52 specified by the introduced address signal TADI is read out at the same time. At that time, since the tester outputs a write control signal TW- having an H level and an output control signal TOE- having an L level, both write operation to the 16 Mbit DRAM 52 and output from the output Q (7:0) of the D flip-flop 51 are disabled.

The multiplexer 53 selects a set of 8-bit data from (8×16)-bit data delivered from the output Q (127:0) of the 16 Mbit DRAM 52 based on an output data selection signal TSEL entered from the tester, and outputs the selected set of 8-bit data as an output data TDO.

Description will be made of the procedure of a conventional method for testing a semiconductor memory device using the above test circuit.

FIG. 11 is a flowchart showing the procedure of a conventional method for testing a semiconductor memory device. It is assumed that the 16 Mbit DRAM 52 having a wide data bus of an (m×n)-bit width has a row address size of x and a column address size of y.

To begin with, (m×n)-bit data entered from the tester is fed to the input D (7:0) of the D flip-flop 51 in units of m bits sequentially as input data TDI, and delivered from the output Q (7:0) when the output control signal TOE- is at an H level. Then, the tester sets the row address X and the column address Y so that X=0 and Y=0, at step ST100.

To write the data into the 16 Mbit DRAM 52, the tester enters an address signal TADI indicating that the row address X=0 and the column address Y=0, and an address strobe signal TAS- having an L level to the corresponding terminals of the 16 Mbit DRAM 52. The current address signal TADI is introduced into the 16 Mbit DRAM 52 at a timing according to the address strobe signal TAS-. With the timing of introduction of the address signal TADI into the DRAM 52, the tester outputs a write control signal TW- having an L level, and as a result, the (m×n)-bit data is written into a memory area (X=0, Y=0) in the 16 Mbit DRAM 52 specified by the address signal TADI at step ST101.

To read out the data written into the 16 Mbit DRAM 52, the tester enters an address signal TADI indicating that the row address X=0 and the column address Y=0, and an address strobe signal TAS- having an L level to the corresponding terminals of the 16 Mbit DRAM 52. The current address signal TADI is introduced into the 16 Mbit DRAM 52 at a timing according to the address strobe signal TAS-. With the timing of introduction of the address signal TADI into the DRAM 52, the tester outputs an output control signal TOE- having an L level, and as a result, the (8×16)-bit data which has been written into the memory area (X=0, Y=0) in the 16 Mbit DRAM 52 specified by the introduced address signal TADI is read out at the same time at step ST102. The multiplexer 53 selects m-bit data indicated by a number N of 0 from the read-out n sets of m-bit data according to an output data selection signal TSEL delivered from the tester, and outputs the selected m-bit data as output data TDO at step ST103. The tester receives the output data TDO, and compares it with an expected value of the corresponding m-bit data to determine whether the output data TDO is correct at step ST104.

If it is determined that the output data TDO is erroneous, the tester obtains the corresponding defective bit information (indicating that the row address X=0, the column address Y=0, and the number N given to the compared m-bit data=0) at step ST105. Then, to test the next m-bit output data TDO, the tester adds 1 to the number N given to the current m-bit data at step ST106, and determines whether the number N is equal to or larger than n at step ST107. On the other hand, at step ST104, if it is determined that the output data TDO is correct, the tester also adds 1 to the number N given to the current m-bit data in order to test the next m-bit output data TDO at step ST106, and determines whether the number N is equal to or larger than n at step ST107.

If the number N is smaller than n, the multiplexer 53 selects m-bit data corresponding to the updated number N according to an output data selection signal TSEL delivered from the tester, and outputs the selected m-bit data as output data TDO at step ST108. The tester then compares the output data TDO with an expected value of the corresponding m-bit data to determine whether the output data TDO is correct. This procedure (steps ST104 through ST108) is repeated.

If it is determined that the number N is equal to or larger than n at step ST107, on the other hand, the tester adds 1 to the column address Y at step ST109, and determines whether the updated column address Y is larger than the column address size y at step ST110. If the column address Y is equal to or smaller than the column address size y, the tester introduces an address signal TADI indicating the updated column address Y by use of an address strobe signal TAS- having an L level, writes and then reads out (m×n)-bit data from the updated column address Y, and determines whether each m-bit data selected by the multiplexer 53 is correct at steps ST101 through ST110.

If it is determined that the updated column address Y is larger than the column address size y at step ST110, on the other hand, the tester adds 1 to the row address X and sets the column address Y to 0 at step ST111., and determines whether the row address X is larger than the row address size x at step ST112. If the row address X is equal to or smaller than the row address size x, the tester introduces an address signal TADI indicating the updated row address X and column address Y by use of an address strobe signal TAS- having an L level, writes and then reads out (m×n)-bit data, and determines whether each m-bit data selected by the multiplexer 53 is correct at steps ST101 through ST112 as described above. This procedure is repeated. If it is determined that the updated row address X is larger than the row address size x at step ST112, on the other hand, the testing of this 16 Mbit DRAM 52 is ended.

With the recent progress in techniques for producing more miniaturized and more highly integrated semiconductor integrated circuits, components such as DRAMs have acquired a greater capacity and a larger number of bits, lately at a rapid pace, which has required shortening of man hours for testing these DRAMs. In the conventional method for testing a semiconductor memory device, however, to test (m×n)-bit data for each address, the data is tested in units of m bits n times, and this test is repeated for each row address and each column address, that is, the test is repeated a number of times equal to the row address size multiplied by the column address size. Accordingly, it is necessary to repeat the test x×y×n times to check all bits of the semiconductor memory device, requiring a large number of man hours and high cost.

SUMMARY OF THE INVENTION

The present invention is provided for solving the problems aforementioned, and it is an object of the present invention to provide a test method for a semiconductor memory device capable of reducing the number of man hours required for the test by determining whether (m×n)-bit data is correct at the same time when the (m×n)-bit data is read out, and ending the test if data in all addresses of the semiconductor memory device is correct, or testing the data in units of m bits otherwise.

According to one aspect of the present invention, a method for testing a semiconductor memory device tests a semiconductor memory device having a wide data bus of an (m×n)-bit width and includes a first process and a second process, wherein the first process comprises the steps of: reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address; and ending testing of the semiconductor memory device if it is determined that the read-out (m×n)-bit data from all addresses of the semiconductor memory device is correct; whereas the second process comprises the steps of: writing (m×n)-bit data into the obtained defective address and then reading out the written (m×n)-bit data; and comparing each m-bit data constituting the read-out (m×n)-bit data with an expected value of a predetermined m-bit data to determine whether the each m-bit data constituting the read-out (m×n)- bit data is correct.

According to another aspect of the present invention, a method for testing a semiconductor memory device tests a semiconductor memory device having a wide data bus of an (m×n)-bit width and includes a first process and a second process, wherein the first process comprising the steps of: reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address; and ending testing of the semiconductor memory device if it is determined that the read-out (m×n)-bit data from all addresses of the semiconductor memory device is correct; whereas the second process comprises the steps of: writing (m×n)-bit data into the obtained defective address and then reading out the written (m×n)-bit data; dividing the read-out (m×n)-bit data into pieces each having a number of bits smaller than m×n and larger than m; comparing each piece of the divided read-out data having said number of bits with a corresponding piece of data obtained as a result of dividing the (m×n)-bit data of its before-written state into pieces each having said number of bits to determine whether the each piece of the divided read-out data is correct; and comparing each m-bit data constituting an erroneous piece of the divided read-out data having said number of bits with an expected value of a predetermined m-bit data to determine whether the each m-bit data constituting the erroneous piece of the divided read-out data is correct.

According to still another aspect of the present invention, in the above method for testing a semiconductor memory device, wherein the first process specifies each address of the semiconductor memory device by increasing or decreasing a row address of the semiconductor memory device by one address at a time for each row, or by increasing or decreasing a column address of the semiconductor memory device by one address at a time for each column in order to test the semiconductor memory device.

According to yet another aspect of the present invention, the above method for testing a semiconductor memory device further includes a third process employed before the first process, the third process comprising the steps of: specifying each address of the semiconductor memory device by increasing or decreasing both a row address and a column address of the semiconductor memory device simultaneously by one address at a time; reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address and determining whether defective memory cells corresponding to the defective address can be repaired by replacing the defective memory cells with redundant memory cells held by the semiconductor memory device; and ending testing of said semiconductor memory device if it is determined that the defective memory cells cannot be repaired.

According to still a further aspect of the present invention, in the above method for testing a semiconductor memory device, wherein the first process further comprises a step of: determining whether defective memory cells corresponding to the defective address can be repaired by replacing the defective memory cells with redundant memory cells held by the semiconductor memory device, if it is determined that (m×n)-bit data stored in a predetermined address is erroneous.

According to yet another aspect of the present invention, in the above method for testing a semiconductor memory device, the second process further comprises a step of: determining whether defective memory cells corresponding to the erroneous m-bit data can be repaired by replacing the defective memory cells with redundant memory cells held by the semiconductor memory device, if it is determined from comparison of m-bit data with an expected value of predetermined m-bit data that the former m-bit data is erroneous.

According to still another aspect of the present invention, in the above method for testing a semiconductor memory device, in the case where one of the first process, the second process, and the third process determines whether a semiconductor memory device which has some defective memory cells corresponding to a defective address or erroneous m-bit data can be repaired by replacing the defective memory cells with redundant memory cells held by the semiconductor memory device, if the number of the defective memory cells is smaller than the number of the redundant memory cells, it is determined that the defective semiconductor memory device can be repaired.

DETAILED DESCRIPTION OF THE PREFERRED EMBODIMENTS

Several embodiments according to the present invention will be described below.
First Embodiment FIG. 1 is a circuit diagram showing the configuration of a test circuit used by a method for testing a semiconductor memory device according to the first embodiment of the present invention.

It should be noted that the test circuit is connected to a testing device (hereinafter referred to as a tester), not shown, to carry out the testing of a semiconductor memory device.

In the following description, a 16 Mbit DRAM (Dynamic Random Access Memory) having a wide data bus of an (m×n)-bit width is used as an example of a semiconductor memory device sample to be tested—in the example of FIG. 1, m=8 (bits) and n=16 (stages), totaling 128 bits.

Figure 1:
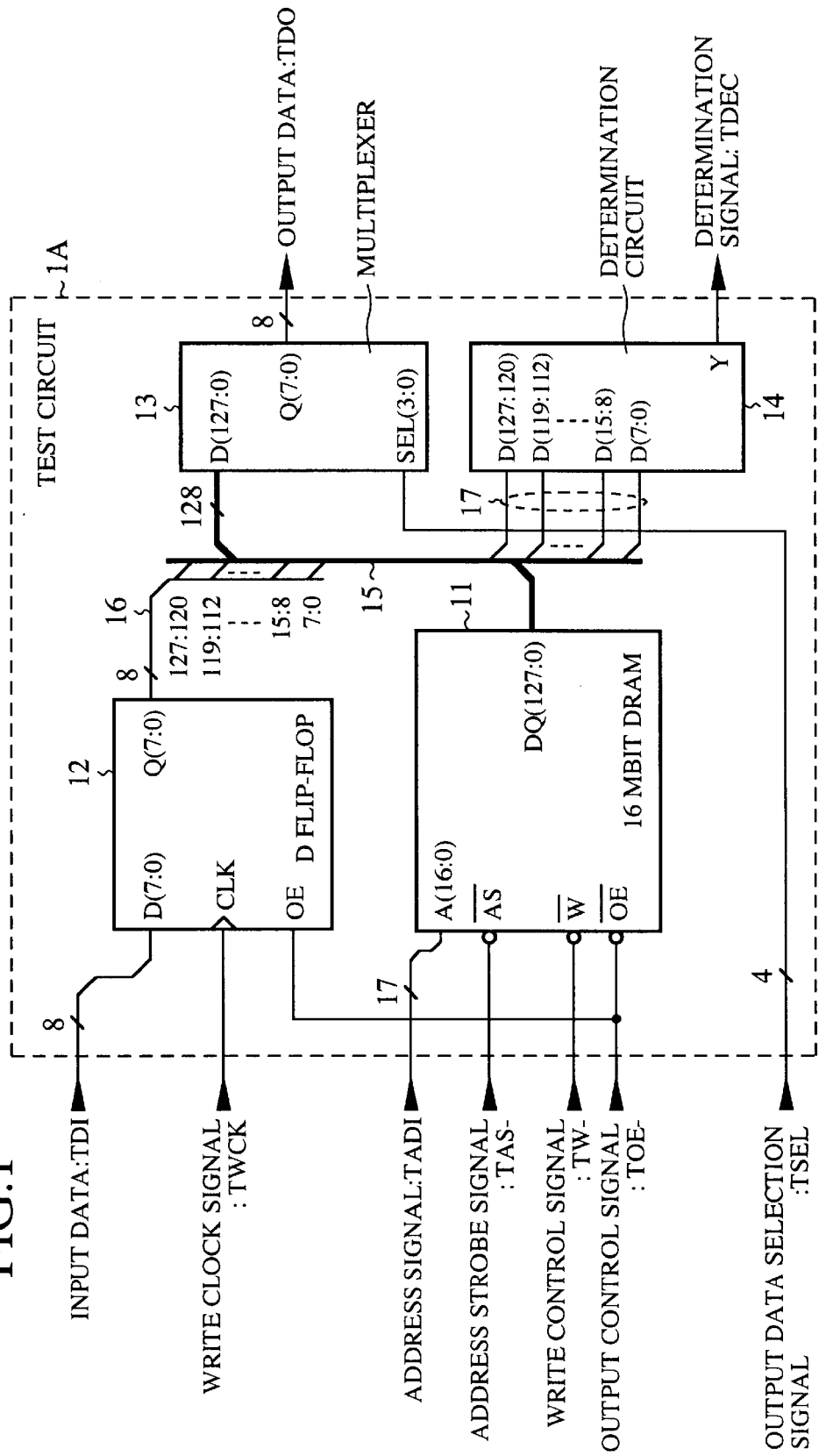
FIG. 1 is a circuit diagram showing a test circuit used by a method for testing a semiconductor memory device according to a first embodiment of the present invention.

Referring to FIG. 1, reference numeral 1A denotes a test circuit for testing a 16 Mbit DRAM while 11 denotes a 16 Mbit DRAM to be tested. The 16 Mbit DRAM 11 in this example has 4096 row addresses and 32 column addresses, that is, a 12-bit row address line and a 5-bit column address line, respectively, totaling 17 bits for the row and column address lines.

Reference numeral 12 denotes an 8-bit D flip-flop which receives input data TDI from an input D (7:0) and holds the data upon a rise of a write clock signal TWCK. The output Q (7:0) of the 8-bit D flip-fop 12 is controlled according to an output control signal TOE- fed from the tester. Reference numeral 13 denotes a 128-to-8 multiplexer which reads out (8×16)-bit data from the 16 Mbit DRAM 11, selects a set of 8 bits from the read-out (8×16)-bit data based on an output data selection signal TSEL fed from the tester, and outputs the selected set of 8 bits as output data TDO.

Reference numeral 14 denotes a determination circuit which compares 16 pieces of 8-bit data, which were output from the D flip-flop 12 yet before being written into the 16 Mbit DRAM 11, with the corresponding read-out 16 pieces of 8-bit data read from the 16 Mbit DRAM 11, and outputs the comparison result as a determination signal TDEC. The determination circuit 14 is provided to determine whether (8×16)-bit data read from each address of the DRAM 11 is correct so that the tester can obtain addresses corresponding to the erroneous data as defective addresses beforehand.

Reference numeral 15 denotes a wide data bus having an (8×16)-bit width; 16 indicates 8-bit data lines used for branching pieces of 8-bit data output from the D flip-flop 12 into 16 lines to feed the 16 pieces of 8-bit data to the wide data bus 15; and 17 denotes data lines used for delivering the 16 pieces of 8-bit data from the wide data bus 15 to the determination circuit 14.

The operation of the test circuit will be described below.

Description will be first made of write operation to the 16 Mbit DRAM 11.

Input data TDI fed in units of 8 bits to the input D (7:0) of the D flip-flop 12 is held upon a rise of a write clock signal TWCK, and is output from the output Q (7:0) according to an output control signal TOE- (having an H level in this case) delivered from the tester to an output control terminal OE. The data delivered from the output Q (7:0) of the D flip-flop 12 is fed to the (8×16)-bit wide data bus 15 through 16 branched data lines 16 each having 8 bits. Then, to write the data into the 16 Mbit DRAM 11, the tester enters an address signal TADI, which indicates a row address and a column address, and an address strobe signal TAS- having an L level, to the corresponding terminals of the 16 Mbit DRAM 11. The current address signal TADI is introduced into the 16 Mbit DRAM 11 at a timing according to the strobe signal TAS-. With the timing of introduction of the address signal TADI into the DRAM 11, the tester outputs a write control signal TW- having an L level, and as a result, the data which has branched out into 16 sets of data each having 8 bits is written into a memory area in the 16 Mbit DRAM 11 specified by the address signal TADI through a terminal DQ (127:0). At that time, since an output control signal TOE- having an H level is fed to the 16 Mbit DRAM 11, the output of the 16 Mbit DRAM 11 is disabled.

Next, description will be made of the read-out and subsequent operations of the test circuit.

To read out the data written into the 16 Mbit DRAM 11, the tester enters an address signal TADI which indicates a row address and a column address, and an address strobe signal TAS- having an L level, to the corresponding terminals of the 16 Mbit DRAM 11. The current address signal TADI is introduced into the 16 Mbit DRAM 11 at a timing according to the address strobe signal TAS-. With the timing of introduction of the address signal TADI into the DRAM 11, the tester outputs an output control signal TOE- having an L level, and as a result, the (8×16)-bit data which has been written into the memory area in the 16 Mbit DRAM 11 specified by the introduced address signal TADI is read out at the same time. At that time, since the write control signal TW- is at an H level, write operation to the 16 Mbit DRAM 11 is disabled.

The (8×16)-bit data read out onto the wide data bus 15 and the corresponding (8×16)-bit data of its before-written state output from the output Q (7:0) of the D flip-flop 12 are transferred to the data lines 17. The determination circuit 14 compares the both data, and outputs a determination signal TDEC to the tester, indicating the comparison result.

Furthermore, the multiplexer 13 selects a set of 8-bit data from the (8×16)-bit data read out from the DRAM 11 onto the wide data bus 15 according to an output data selection signal TSEL delivered from the tester, and outputs the selected set of 8-bit data as output data TDO.

Figure 2:
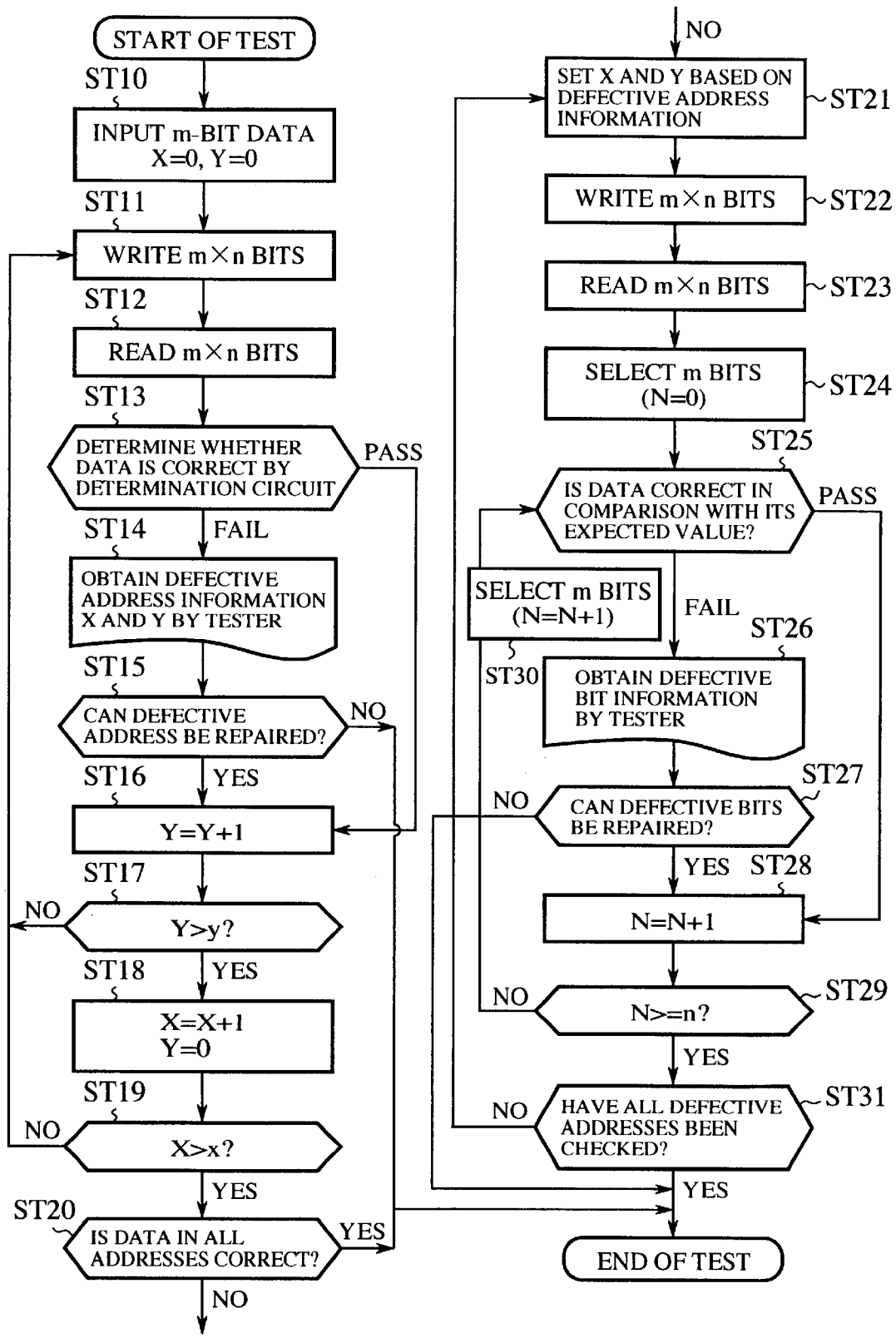
FIG. 2 is a flowchart showing the procedure of a method for testing a semiconductor memory device according to the first embodiment of the present invention.

Next, description will be made of a method for testing a semiconductor memory device according to the first embodiment of the present invention. FIG. 2 is a flowchart showing the procedure of a method for testing a semiconductor memory device according to the first embodiment of the present invention. It is assumed that the 16 Mbit DRAM 11 has a row address size of x and a column address size of y. The 16 Mbit DRAM 11 is also assumed to have redundant memory cells for replacing defective cells, in addition to its rated memory capacity.

Description will be first made of a process (a first process) which determines whether data is correct in units of m×n bits at the same time by use of the determination circuit 14, and obtains an address corresponding to the data of a set of m×n bits determined to be erroneous before performing a functional test of the 16 Mbit DRAM 11.

It should be noted that the expression "m×n bits" assumes 8×16 bits as described above.

Figure 3:
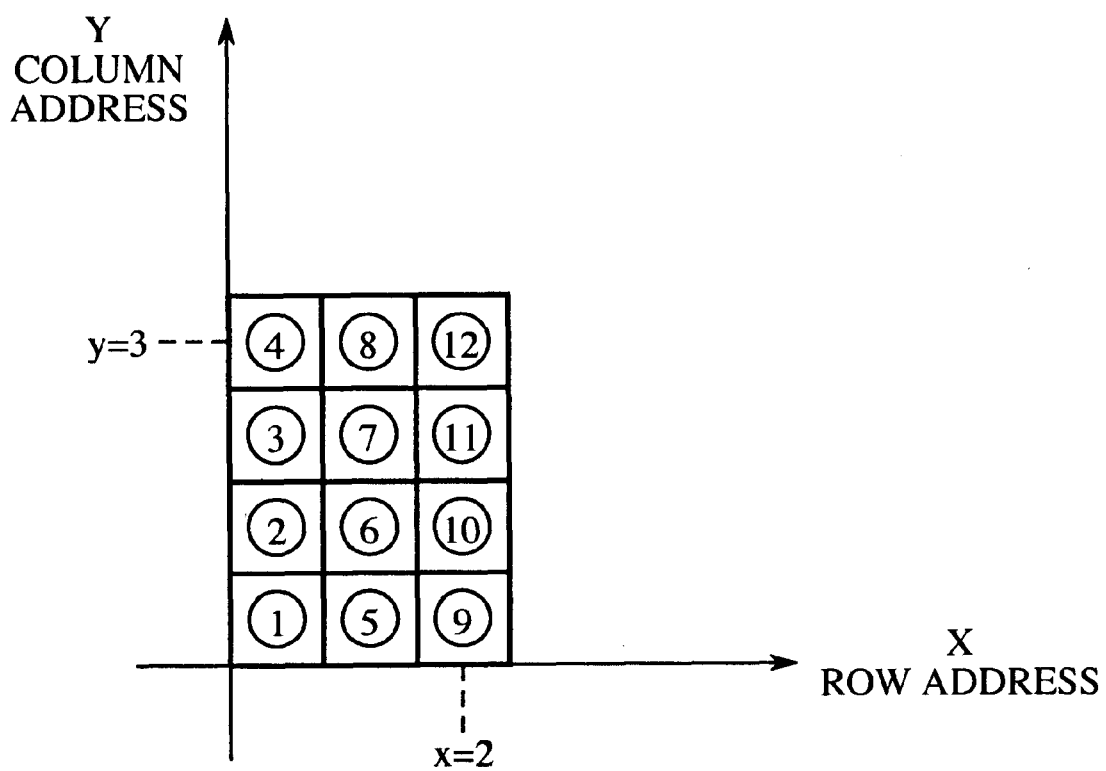
FIG. 3 is a schematic diagram showing a memory area of a semiconductor memory device according to the first embodiment of the present invention.

FIG. 3 is a schematic diagram showing a memory area of the 16 Mbit DRAM 11. In the figure, the horizontal axis X represents the row address while the vertical axis Y represents the column address. The figure indicates an example of a semiconductor memory device which employs a memory area having a row address size x of 2 and a column address size y of 3 (when x<y). It should be noted that the counting of each address size starts from a number of 0. The addresses in the figure are numbered in the order of testing them when the memory area of the semiconductor memory device is tested in the first process. That is, the test is performed while incrementing the column address Y one by one until Y>y. Then, the row address X is incremented by one, and the column address Y is incremented one by one until Y>y again. The same procedure is repeated until X=x.

To begin with, m-bit data output from the tester is fed to the input D (7:0) of the D flip-flop 12 as input data TDI. This m-bit input data TDI is held upon a rise of a write clock signal TWCK, and is output when the output control signal TOE- is at an H level. Then, the tester sets the row address X and the column address Y so that X=0 and Y=0, at step ST10.

To write the data into the 16 Mbit DRAM 11, the tester enters an address signal TADI indicating that the row address X=0 and the column address Y=0, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs a write control signal TW- having an L level, and as a result, (m×n)-bit data output from the output Q (7:0) of the D flip-flop 12 onto the wide data bus 15 is written into a memory area (X=0, Y=0) of the 16 Mbit DRAM 11 specified by the address signal TADI through the terminal DQ (127:0) at step ST11.

To read out the data written into the 16 Mbit DRAM 11, the tester enters an address signal TADI indicating that the row address X=0 and the column address Y=0, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs an output control signal TOE- having an L level, and as a result, the (m×n)-bit data which has been written into the memory area (X=0, Y=0) in the 16 Mbit DRAM 11 specified by the address signal TADI is read out from the terminal DQ (127:0) onto the wide data bus 15 at the same time at step ST12.

The determination circuit 14 compares the (m×n)-bit data read out from the memory area corresponding to a row address X of 0 and a column address Y of 0 with the corresponding (m×n)-bit data output from the output Q (7:0) of the D flip-flop 12 to determine whether the read-out (m×n)-bit data is correct at step ST13. This process of determining the correctness of m×n bits at the same time by use of the determination circuit 14 is employed because it is possible to check the correctness of data in all addresses in units of m×n bits beforehand, and if the data in all addresses is correct with no defective address, the testing of the 16 Mbit DRAM 11 can be ended. If an error is found in the data, it is possible to test only data in the defective address in units of m bits, reducing man hours required for the test.

If it is determined from the comparison result that the read-out (m×n)-bit data is erroneous, the tester obtains the corresponding defective address information X and Y (in this case, X=0 and Y=0) at step ST14, and determines whether the defective bits can be corrected at step ST15.

When the number of the memory cells corresponding to the defective address exceeds the number of the redundant memory cells described above, it is determined that the defective bits cannot be corrected. By repairing 16 Mbit DRAMs 11 having some defective bits by use of their redundant cells, it is possible to improve their production yield.

If it is determined that the defective bits can be corrected, the tester increments the column address Y by one to test (m×n)-bit data in the next address at step ST16. Incidentally, since data in addresses is checked for correctness in the direction of the column address Y sequentially, it is possible to find a linear fault mode in the 16 Mbit DRAM 11. A linear fault mode is a fault mode in which once a defective address is detected, other defective addresses can be found sequentially in one direction from the detected defective address.

The tester determines whether the column address Y exceeds the column address size y at step ST17. On the other hand, if it is determined that the defective bits cannot be corrected at step ST15, the tester terminates the testing of the 16 Mbit DRAM 11.

Thus, by adding a process for determining whether erroneous m×n-bit data can be corrected, it is possible to omit the later-explained testing of data in units of m bits performed by the tester (steps ST21 through ST31 described later) if it is determined that the erroneous m×n-bit data (the corresponding defective bits) cannot be corrected.

If it is determined that the column address Y is equal to or smaller than the column address size y at step ST17, the tester introduces an address signal TADI indicating the updated column address Y according to an address strobe signal TAS-, and writes and then reads out (m×n)-bit data. Then, as described above, the determination circuit 14 determines whether the (m×n)-bit data is correct, and the tester obtains defective address information, if any, to determine whether the defective bits can be corrected. The above procedure (steps ST11 through ST17) is repeated until it is determined that the column address Y exceeds the column address size y at step ST17. If this happens, the tester adds 1 to the row address X and sets the column address Y to 0 at step ST18, and determines whether the row address X exceeds the row address size x at step ST19.

If it is determined that the row address X is equal to or smaller than the row address size x, the tester introduces an address signal TADI indicating the updated row address X and the updated column address Y according to an address strobe signal TAS-, and writes and then reads out (m×n)-bit data. Then, the determination circuit 14 determines whether the (m×n)-bit data is correct, and the tester obtains defective address information, if any, to determine whether the defective bits can be corrected. The above procedure (steps ST11 through ST19) is repeated until it is determined that the row address X exceeds the row address size x at step ST19. If this happens, at step ST20 the tester checks whether data in all addresses is correct, that is, whether the determination circuit 14 has determined that data in all addresses is correct without any defective address at step ST13. If it is determined that data in all addresses is correct at step 20, the tester ends the testing of the 16 Mbit DRAM 11. Thus, by adding a process for determining whether data in all addresses is correct, it is possible to omit the later-explained testing of data in units of m bits performed by the tester (steps ST21 through ST31 described later) if it is determined that data in all addresses is correct.

Next, description will be made of a second process performed when there exists an address determined to be defective. This process compares each m-bit data corresponding to the defective address with its expected value, and determines whether the defective address can be repaired.

At step 21, if it is determined that there exists an address determined to be defective at step 20, the tester sets the row address X and the column address Y to values corresponding to the defective address obtained at step ST14. Then, to write data into the 16 Mbit DRAM, the tester enters an address signal TADI indicating the set row address X and column address Y, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs a write control signal TW- having an L level, and as a result, (m×n)-bit data output from the output Q (7:0) of the D flip-flop onto the wide data bus 15 is written into a memory area (X, Y) in the 16 Mbit DRAM 11 specified by the address signal TADI through the terminal DQ (127:0) at step ST22.

To read out the data written into the 16 Mbit DRAM 11, the tester enters an address signal TADI indicating the set row address X and column address Y, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs an output control signal TOE- having an L level, and as a result, the (m×n)-bit data which has been written into the memory area (X, Y) in the 16 Mbit DRAM 11 specified by the address signal TADI is read out from the terminal DQ (127:0) onto the wide data bus 15 at the same time at step ST23. The multiplexer 13 selects m-bit data indicated by a number N of 0 from the read-out n sets of m-bit data according to an output data selection signal TSEL delivered from the tester, and outputs the selected m-bit data as output data TDO at step ST24. The tester receives the output data TDO, and compares it with a corresponding m-bit expected value to determine whether the output data TDO is correct at step ST25.

If it is determined from the comparison result that the output data TDO is erroneous, the tester determines that the m bits are defective, and obtains and holds the defective bit information (in this case, the row address X and column address Y, and the number N given to the m-bit data) at step ST26. The tester then determines whether the defective bits can be corrected at step ST27. It should be noted that whether the defective bits can be corrected is determined in the same way as it is determined at step ST15 described above. If it is determined that the defective bits cannot be corrected, the tester terminates the testing of the 16 Mbit DRAM 11. On the other hand, if it is determined that the output data TDO is correct by comparing it with the corresponding expected value at step ST25, or it is determined that the defective bits can be corrected at step ST27, the tester adds 1 to the number N to test the next m-bit data at step ST28, and compares the updated number N with the number n, which indicates the number of m-bit data sets making up (m×n)-bit data, at step ST29. If the number N is smaller than n, the multiplexer 13 selects the Nth m-bit data at step ST30, and outputs the selected Nth m-bit data as output data TDO. The tester receives the output data TDO, compares it with a corresponding m-bit expected value to determine the correctness of the output data TDO, obtains the defective bit information if any, and determines whether defective bits can be corrected. The above procedure (steps ST25 through ST30) is repeated.

If it is determined that the number N is equal to or larger than n at step ST29, the tester determines whether data in all the defective addresses obtained at step ST14 has been checked for correctness, at step ST31. If it is determined that the data in all the defective addresses have been checked for correctness, the tester ends the testing of the 16 Mbit DRAM 11. On the other hand, if it is determined that not all of the defective addresses have yet been checked at step ST31, the tester compares each m-bit data corresponding to the next defective address with its expected value, obtains the defective bit information, and determines whether the defective bits can be corrected. The above procedure (steps ST21 through ST31) is repeated.

Incidentally, in the above descriptions of the method for testing the 16 Mbit DRAM 11, the column address Y is incremented one by one for each column. However, the column address Y may be decremented one by one for each column with the same effect. Furthermore, the 16 Mbit DRAM 11 may be tested by incrementing or decrementing the row address X one by one. At that time, the start address may be one of (0, 0), (x, y), (x, 0), and (0, y), all with the same effect.

In the above descriptions, the present invention uses a 16 Mbit DRAM as a semiconductor memory device sample. However, the present invention can be applied to other semiconductor memory devices such as SRAMs (Static Random Access Memories), producing the same effect.

As described above, according to the first embodiment of the present invention, the determination circuit 14 checks data in all addresses of the 16 Mbit DRAM 11 for correctness in units of m×n bits, and if it is determined that the data in all the addresses is correct, the test is ended. If it is determined that there exists an address whose data is judged to be erroneous, on the other hand, each m-bit data constituting (m×n)-bit data which has been read out from the defective address onto the wide data bus 15 is compared with an expected value of corresponding m-bit data prepared beforehand in order to determine whether the each read-out m-bit data is correct. If the read-out m-bit data is erroneous, it is determined whether the defective bits can be corrected. With these arrangements, if it is determined that there is no defective address in the 16 Mbit DRAM, this means that it is not necessary to carry out a process in which erroneous data is compared with its expected value in units of m bits and determine whether the erroneous data can be corrected. Furthermore, when a defective address has been found, it is only necessary to test the defective address alone by comparing data in the defective address with its expected value in units of m bits and determining whether the address can be repaired, which considerably reduces man hours required for the testing of the 16 Mbit DRAM 11.

Further, according to the first embodiment of the present invention, since the determination circuit 14 checks data in all addresses of the 16 Mbit DRAM 11 for correctness in units of m×n bits by incrementing or decrementing the row address X one by one for each row (or the column address Y one by one for each column) so as to determine the correctness of each address sequentially in one direction, it is possible to find a linear fault mode in the 16 Mbit DRAM 11.

Still further, according to the first embodiment of the present invention, when the determination circuit 14 has determined that (m×n)-bit data is erroneous, which is indicated by a line "Fail" at step ST13, or when comparison of m-bit data in a defective address with its expected value indicates that the m-bit data is erroneous, which is indicated by a line "Fail" at step ST25, whether the 16 Mbit DRAM 11 having such erroneous data can be repaired is checked at steps ST15 and ST27. This makes it possible to repair a 16 Mbit DRAM 11 having some defective bits by use of redundant cells for a repair and use the 16 Mbit DRAM 11 at its rated capacity, improving the yield of the 16 Mbit DRAMs 11.

Second Embodiment

The configuration of a test circuit according to a second embodiment is the same as that of the first embodiment shown in FIG. 1.

Figure 4:
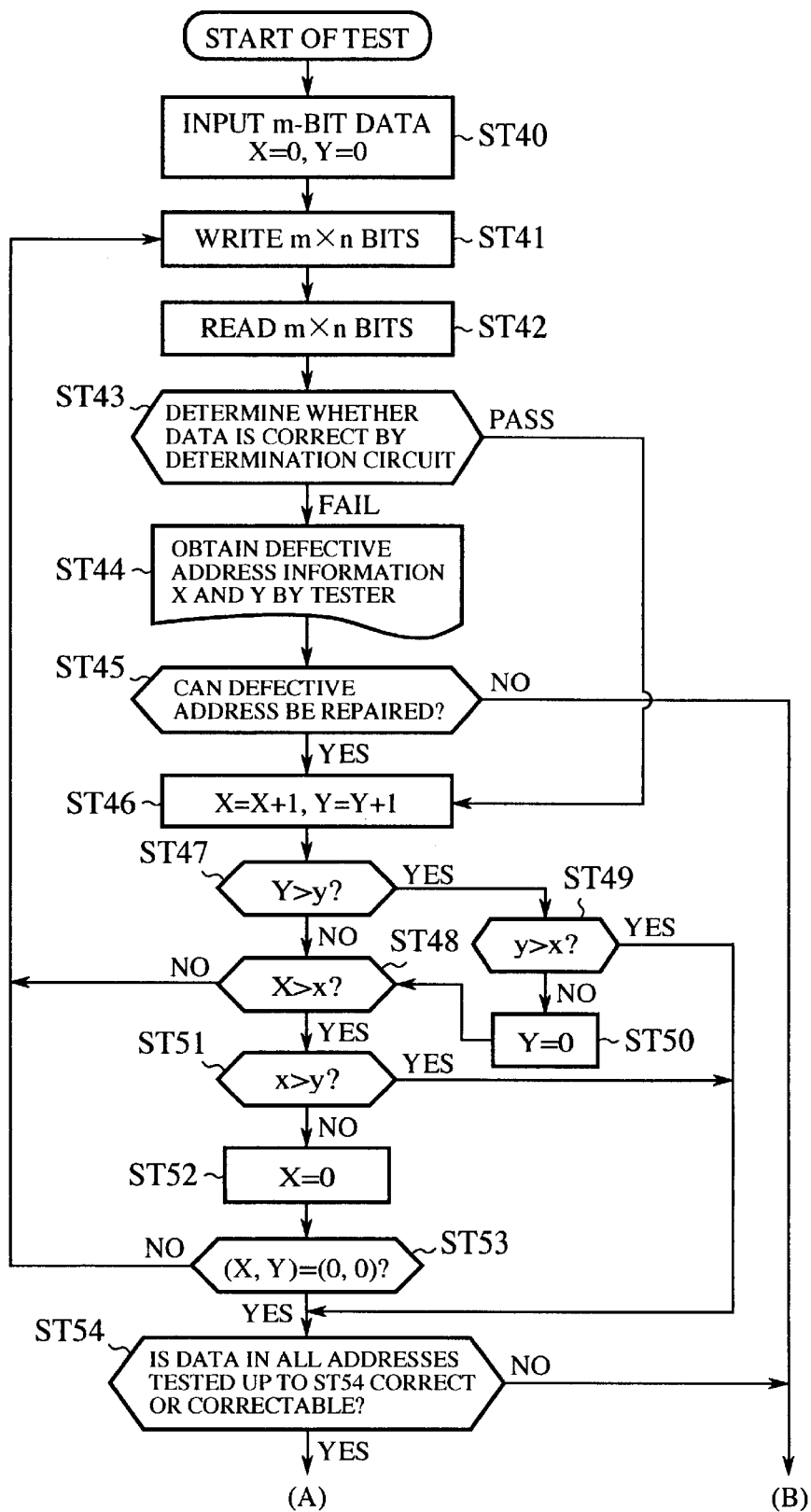
FIG. 4 is a flowchart showing the procedure of a method for testing a semiconductor memory device according to a second embodiment of the present invention.
Figure 5:
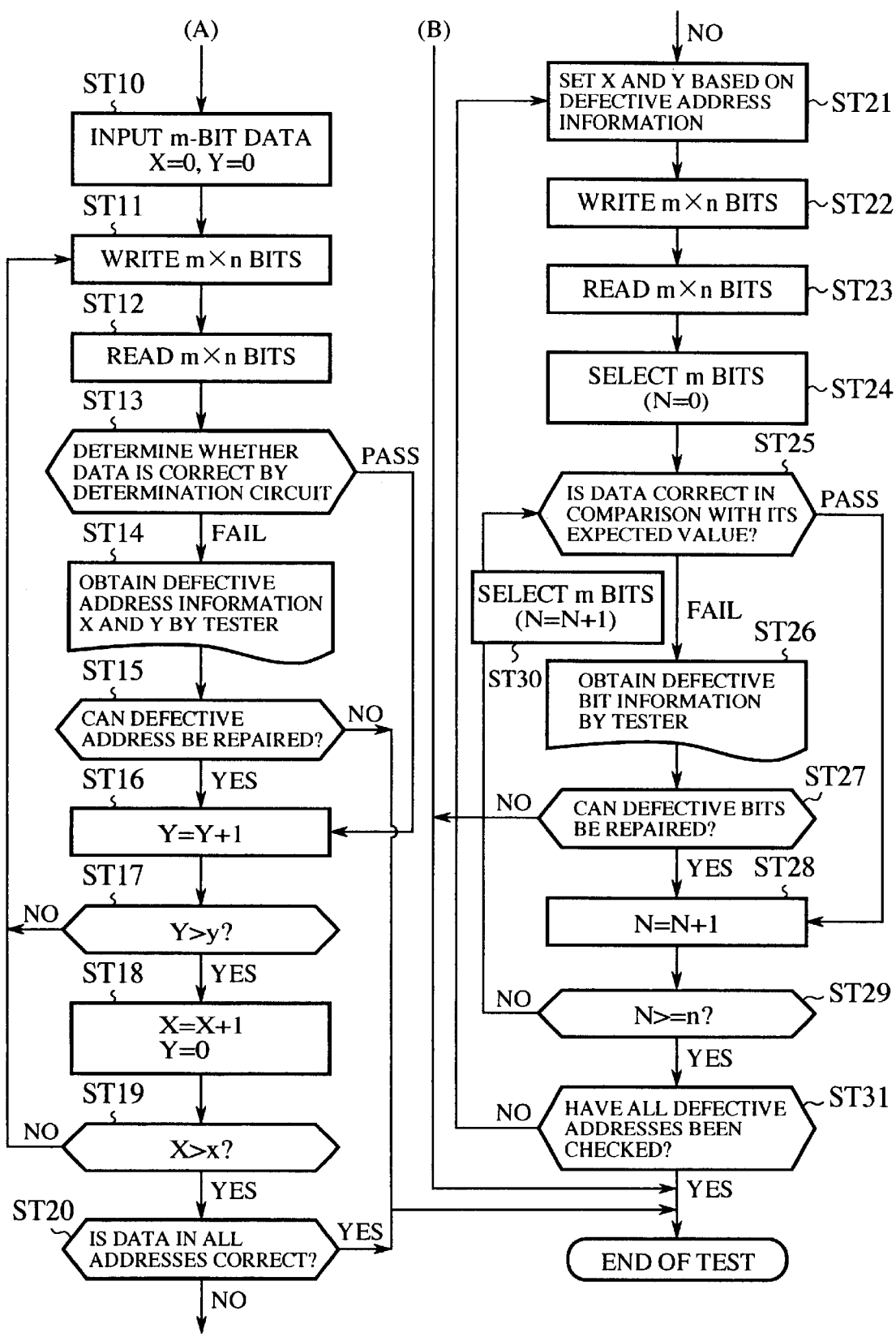
FIG. 5 is a flowchart showing the procedure of a method for testing a semiconductor memory device according to the second embodiment of the present invention.

FIGS. 4 and 5 are flowcharts showing the procedure of a method for testing a semiconductor memory device according to the second embodiment of the present invention. This method for testing a semiconductor memory device increments or decrements the row address and column address at the same time by one address at a time. To test z number of semiconductor memory devices in the conventional method in which either the row address X or the column address Y is incremented or decremented one by one, it is necessary to carry out the corresponding operation x×y×z times. This method of the second embodiment, on the other hand, requires such operation a smaller number of times to perform the testing of the same z number of 16 Mbit DRAMs 11.

Figure 6A:
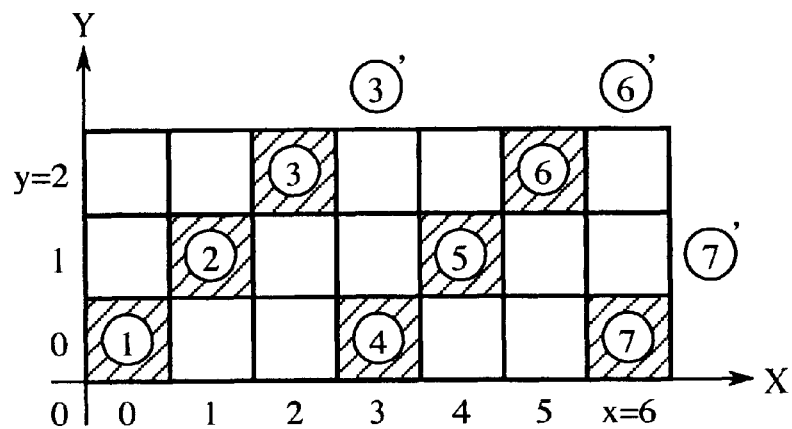
FIGS. 6A through 6C are schematic diagrams showing a memory area of a semiconductor memory device according to the second embodiment of the present invention.
Figure 6B:
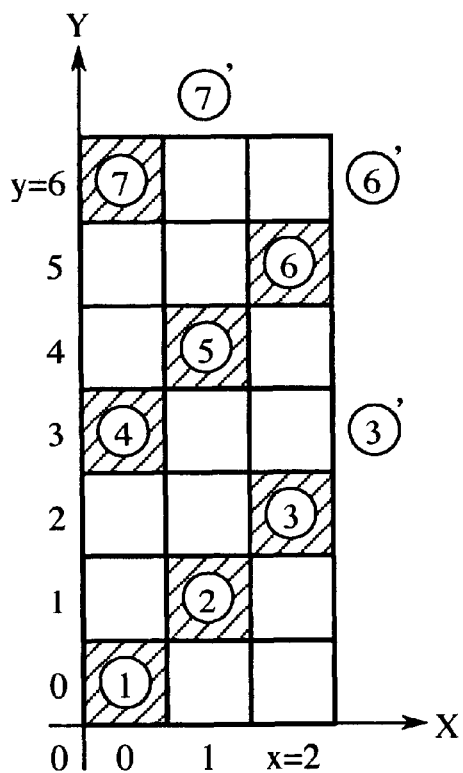
Figure 6C:
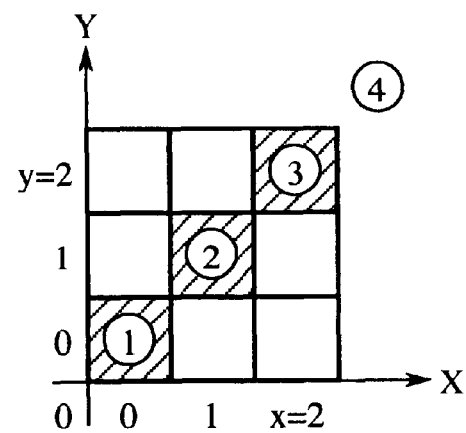

FIGS. 6A through 6C are schematic diagrams showing a memory area of the 16 Mbit DRAM 11. In the figures, the horizontal axis X represents the row address while the vertical axis represents the column address. FIG. 6A shows a memory area example of a semiconductor memory device having a row address size x of 6 and a column address size y of 2 (when x>y); FIG. 6B shows a memory area example having a row address size of 2 and a column address size of 6 (when x<y); and FIG. 6C shows a memory area example having a row address size of 2 and a column address size of 2 (when x=y). It should be noted that as in the first embodiment, the counting of each address size starts from a number of 0. In the figure, reference numerals ①through ⑦ and ①through ③indicate the order of testing addresses in a memory area of a semiconductor memory device according to the method of the second embodiment in which the row address X and column address Y are incremented or decremented at the same time one by one.

Since the flow of steps ST40 through ST45 in FIG. 4 are the same as the flow of steps ST10 through ST15 in FIG. 2, the explanation of these steps will be omitted.

The process indicated by the flow of steps ST46 through ST53 in FIG. 4 determines whether the row address X and the column address Y are within the row address size x and the column address size y of the 16 Mbit DRAM 11 respectively, that is, whether each address is within the existing memory area after the row address X and the column address Y have been incremented one by one.

Referring to FIG. 4, if it is determined that the read-out (m×n)-bit data is correct at step ST43, or if it is determined that the defective address can be repaired at step ST45, the tester increments both the row address X and the column address Y by one at step ST46 and determines whether the column address Y is larger than the column address size y at step ST47 in order to test the next (m×n)-bit data.

If the column address Y is equal to or smaller than the column address size y, the tester determines whether the row address X is larger than the row address size x at step ST48.

If it is determined that the column address Y is larger than the column address size y at step ST47, on the other hand, the tester determines whether the column address size y is larger than the row address size x at step ST49. If the column address size y is equal to or smaller than the row address size x as shown in FIG. 6A, the tester sets the column address Y to 0 at step ST50, and determines whether the row address X is larger than the row address size x at step ST48.

If the row address X is equal to or smaller than the row address size x, the tester introduces an address signal TADI indicating the updated row address X and column address Y into the 16 Mbit DRAM 11 according to an address strobe signal TAS-, and writes-and then reads out (m×n)-bit data. Then, the determination circuit 14 determines whether the (m×n)-bit data is correct, and the tester obtains defective address information, if any, to determine whether the defective bits can be corrected. The above procedure (steps ST41 through ST48) is repeated.

On the other hand, if the row address X is larger than the row address size x at step ST48, the tester determines whether the row address size x is larger than the column address size y at step ST51. If the row address size x is equal to or smaller than the column address size y as shown in FIG. 6(ii), the tester sets the row address X to 0 at step ST52, and determines whether both the row address X and the column address Y are 0 at step ST53.

If either the row address X or the column address Y is set at 0, the tester introduces an address signal TADI indicating the updated row address X and column address Y into the 16 Mbit DRAM 11 according to an address strobe signal TAS-, and writes and then reads out (m×n)-bit data. Then, the determination circuit 14 determines whether the (m×n)-bit data is correct, and the tester obtains defective address information, if any, to determine whether the defective bits can be corrected. After that, if it is determined that the defective bits can be corrected, the tester updates the row address X and the column address Y, and checks whether the updated row address X and column address Y are equal to or smaller than their rated sizes. The above procedure (steps ST41 through ST53) is repeated.

If it is determined that the column address size y is larger than the row address size x at step ST49, or if it is determined that the row address size x is larger than the column address size y at step 51, or if it is determined that both the row address X and the column address Y are set at 0 at step ST53 as shown in FIG. 6(iii), the tester determines whether data in all addresses checked up to step ST54 is correct, that is, determines whether data in all addresses has been determined to be correct at step ST43 at which the determination circuit 14 determines whether each (m×n)-bit data is correct, or whether it has been determined that all defective addresses can be repaired at step ST45 (step ST54). If data in all the addresses is correct, or all defective addresses can be repaired, the process flow proceeds to step ST10; otherwise (the result is NO at step ST54) the testing of this 16 Mbit DRAM 11 is ended.

Referring to FIGS. 6A through 6C, processes at steps ST47 through ST54 are described using a specific example. FIG. 6A shows a memory area example having a row address x of 6 and a column address y of 2 (x>y). The row address X and the column address Y are incremented at the same time one by one (①through ③). Numeral ③' in FIG. 6A indicates an address outside the memory area (X=3, Y=3, and the result is YES at step ST47). At that time, it is necessary to determine whether there remains any address in the memory area available for the subsequent test, and if not, the test must be terminated. That is, if y>x at step ST49, the test should be ended. If the column address size y is smaller than the row address size x as shown in FIG. 6A, it is determined that there remains an address area to be tested (the result is NO at step ST49). Accordingly, the tester sets the column address Y to 0 at step ST50, and performs subsequent tests (④through ⑥). The above procedure is also performed for the address indicated by Numeral ⑥' in FIG. 6A, that is, X=6 and Y=3.

Numeral ⑦' in FIG. 6A indicates an address (X=7, Y=1) representing the case in which the row address X has become larger than the row address size x for the first time; specifically, X=7 and x=6 (the result is YES at step ST48). As in the above case, in order to check whether there remains any address in the memory area available for the subsequent test, it is determined whether x>y at step ST51. In this case, since the row address size x is larger than the column address size y (the result is YES at step ST51), it is determined that it is not necessary to continue the test. Accordingly, the process flow proceeds to the process at step ST54, which determines whether data in all the addresses is correct.

FIG. 6B indicates a memory area example having a row address size of 2 and a column address size of 6 (x<y). The above description of the example in FIG. 6A can be applied to this case.

In the example of the address (X=4, Y=4) indicated by ④ in FIG. 6C, the process flow proceeds as follows.

The result is YES at step ST47, and at step ST49, the result is NO since x=y, setting the column address Y to 0 at step 50. Since it is determined that the row address X (=4) is larger than the row address size x (=3) at step ST48, and the row address size x is equal to the column address size y at step ST51, the row address X is so set that X=0 at step ST52. Then, since (X, Y)=(0, 0) at step ST53, the process flow proceeds to the process at step ST54, which determines whether data in all the addresses is correct.

Since the steps taken after this step, that is, steps ST10 through ST30 in FIG. 5, are the same as steps ST10 through ST31 in FIG. 2, the explanation of these steps will be omitted.

It should be noted that in a case such as the method of the second embodiment in which the row address X and the column address Y are incremented or decremented at the same time one by one to test the 16 Mbit DRAM 11, all addresses of the 16 Mbit DRAM 11 are not tested. Therefore, the testing of the 16 Mbit DRAM 11 is not terminated even when data in addresses checked up to step ST54 has been correct. This method is employed in order to quickly find semiconductor memory devices which cannot be repaired, from among a number of semiconductor memory devices.

In the above descriptions of the method for testing the 16 Mbit DRAM 11, the row address X and the column address Y are incremented at the same time by one address at a time. However, the row address X and the column address Y may be decremented at the same time by one address at a time after setting the row address X and the column address Y so that X=x and Y=y, which produces the same effect.

According to the second embodiment described above, the determination circuit 14 checks data in addresses of the 16 Mbit DRAM 11 in units of m×n bits to determine whether the 16 Mbit DRAM 11 is defective while incrementing or decrementing the row address X and the column address Y at the same time one by one. With this arrangement, it is possible to quickly detect a 16 Mbit DRAM 11 sample which cannot be repaired, from among a number of 16 Mbit DRAM 11 samples, reducing man hours required for testing the entire samples.

Third Embodiment

Figure 7:
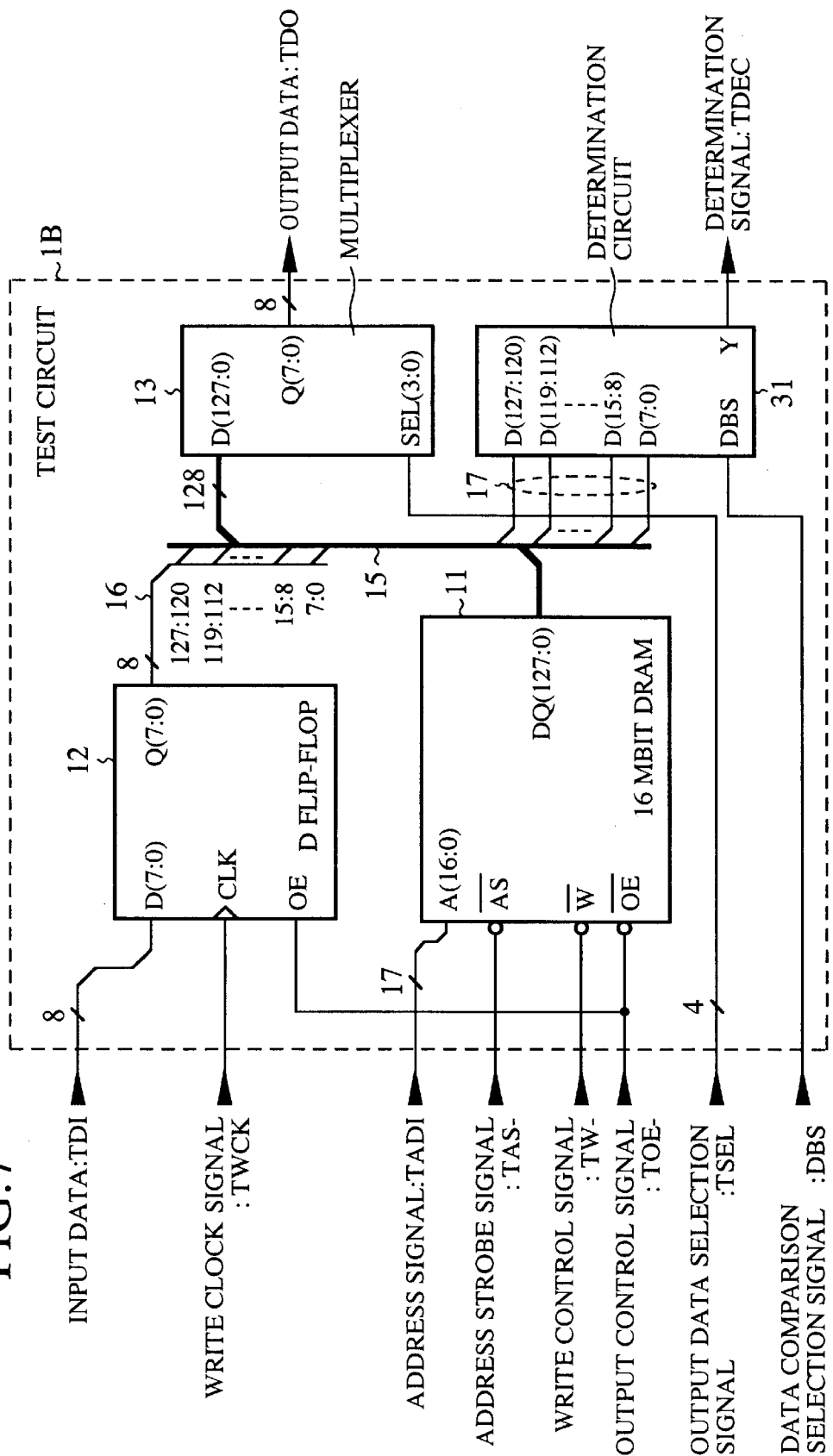
FIG. 7 is a circuit diagram showing a test circuit used by a method for testing a semiconductor memory device according to a third embodiment of the present invention.

FIG. 7 is a circuit diagram showing the configuration of a test circuit used by a method for testing a semiconductor memory device according to a third embodiment of the present invention.

The method for testing a semiconductor memory device according to the third embodiment adds to the first embodiment another procedure for determining whether read-out data is correct so as to narrow down sets of m bits to be tested from those corresponding to an obtained defective address by use of a number given to each set of m bits, reducing the number of tests necessary to perform for each m-bit data.

Since components in FIG. 7 which are the same as those of the first embodiment shown in FIG. 1 are denoted by like numerals, the functional explanation of these components will be omitted, and only different points are described. Reference numeral 31 denotes a determination circuit for determining a division unit by which to divide (m×n)-bit data based on a data comparison selection signal DBS delivered from the tester, and determines whether each piece of divided bit data is correct. The other configurations are the same as those of the first embodiment.

Upon receiving a data comparison selection signal DBS, the determination circuit 31 divides (m×n)-bit data read at the same time from the 16 Mbit DRAM 11 onto the wide data bus 15 into pieces each having a number of bits (m×n/k) smaller than m×n and larger than m so as to be able to determine whether the read-out (m×n)-bit data is correct in units of the above number of bits. For example, when m=8 and n=16, a value of 2, 4, or 8 may be used as the division number k, producing a unit (m×n/k) of 8×8, 4×8, or 2×8 bits, respectively. This unit is used when correctness of data is determined. It should be noted that when k=1, the calculated unit is 6×8 bits, which is equivalent to that used in the first embodiment.

Figure 8:
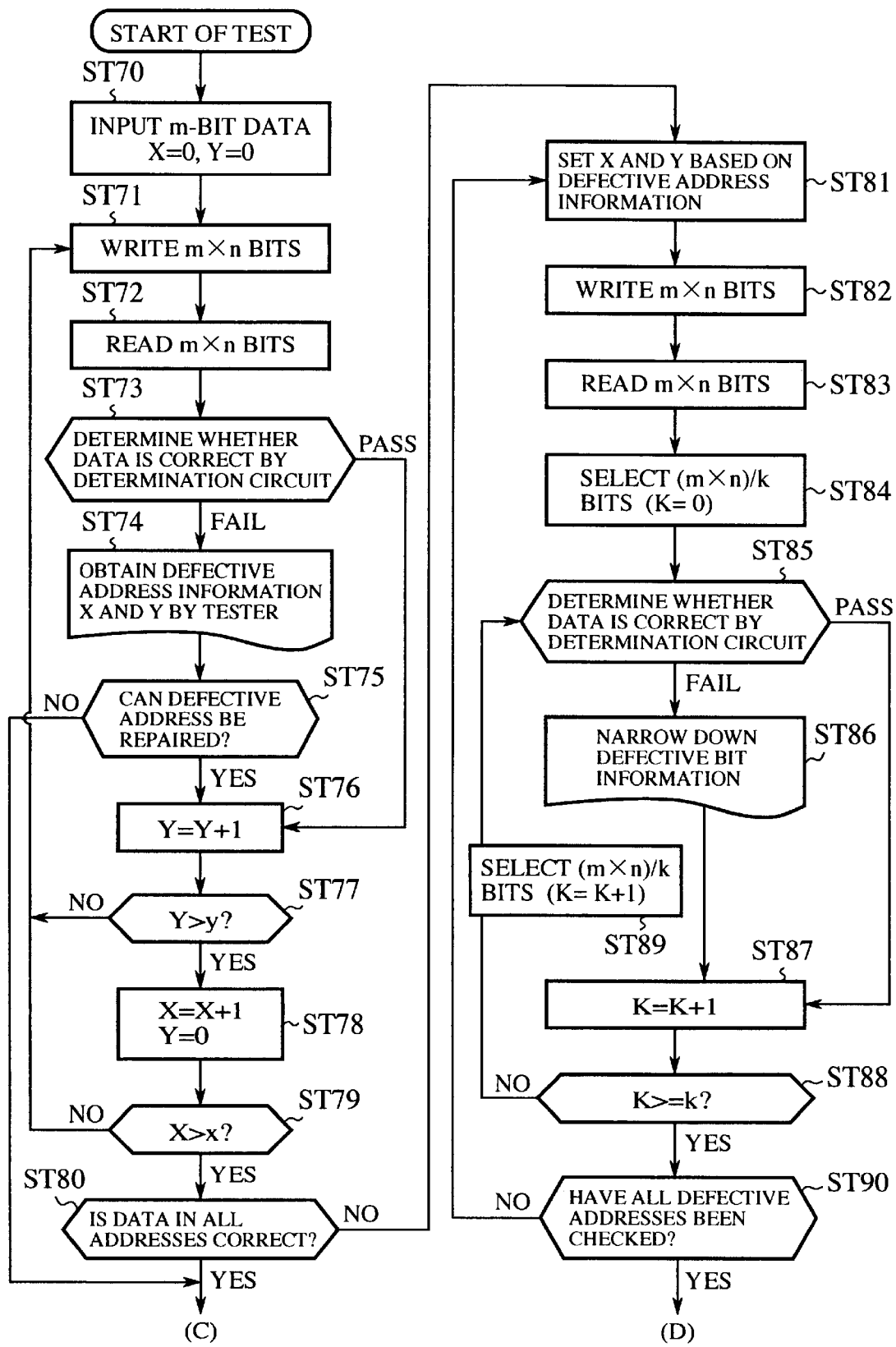
FIG. 8 is a flowchart showing the procedure of a method for testing a semiconductor memory device according to the third embodiment of the present invention.
Figure 9:
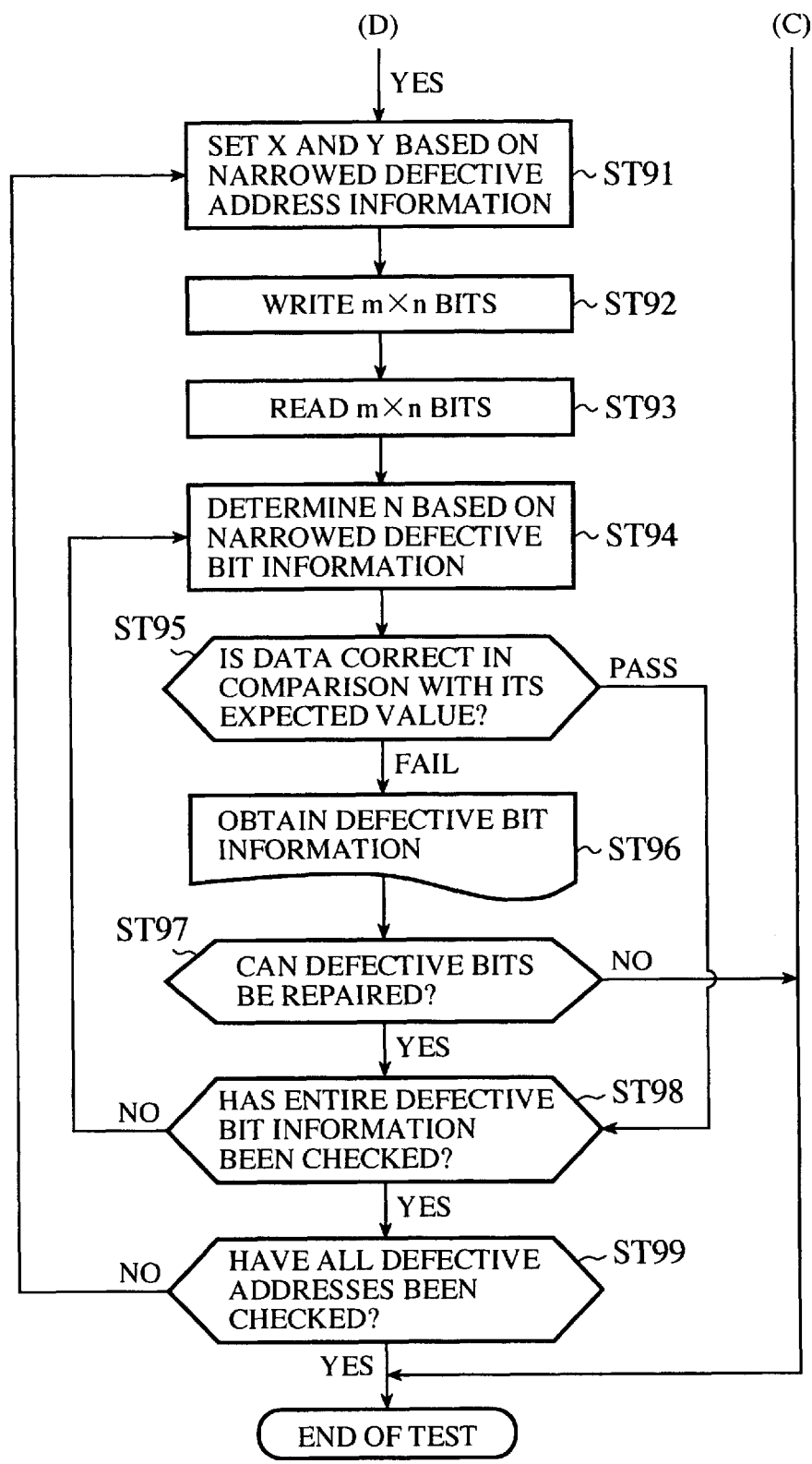
FIG. 9 is a flowchart showing the procedure of a method for testing a semiconductor memory device according to the third embodiment of the present invention.
Figure 10:
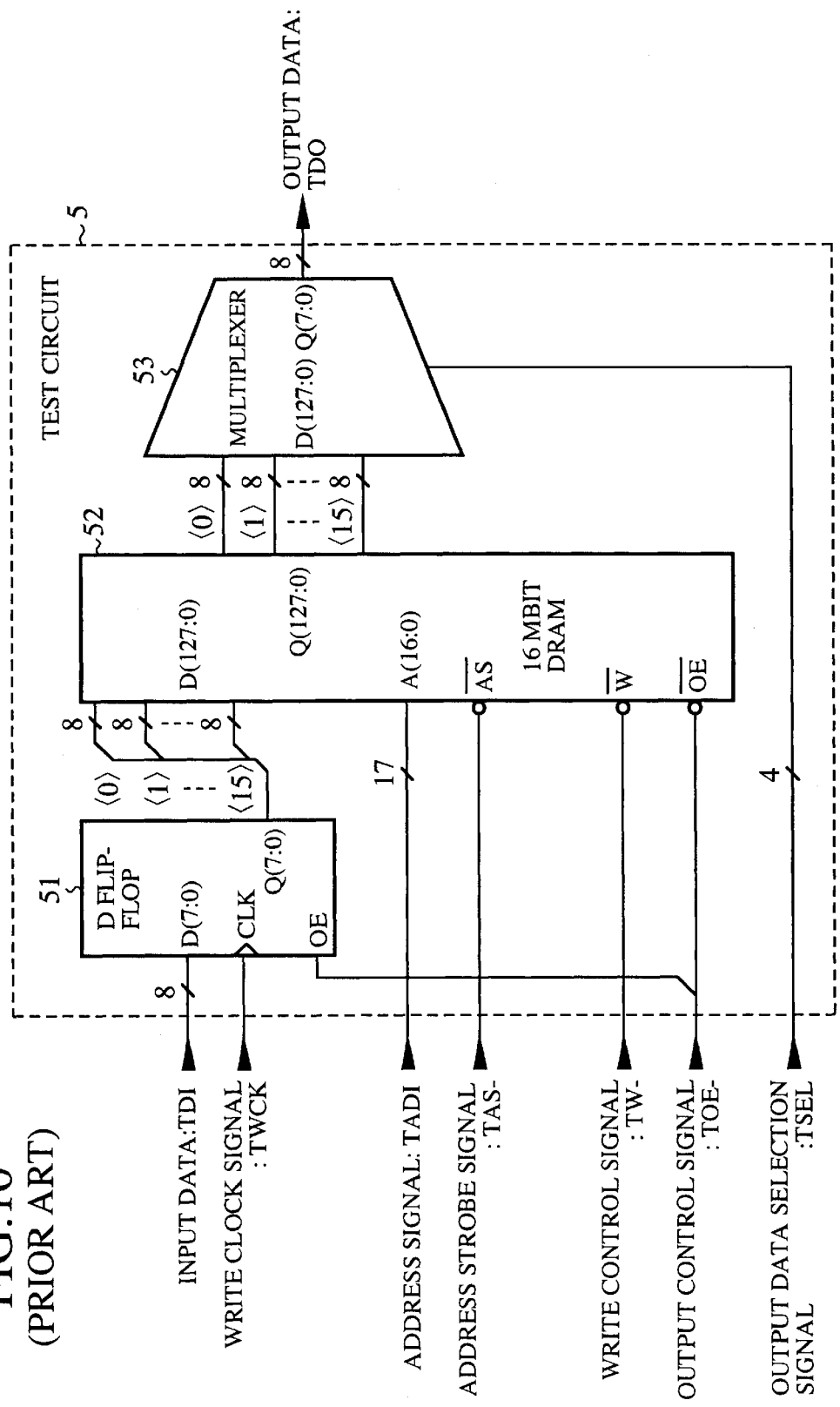
FIG. 10 is a circuit diagram showing a test circuit used by a conventional method for testing a semiconductor memory device.
Figure 11:
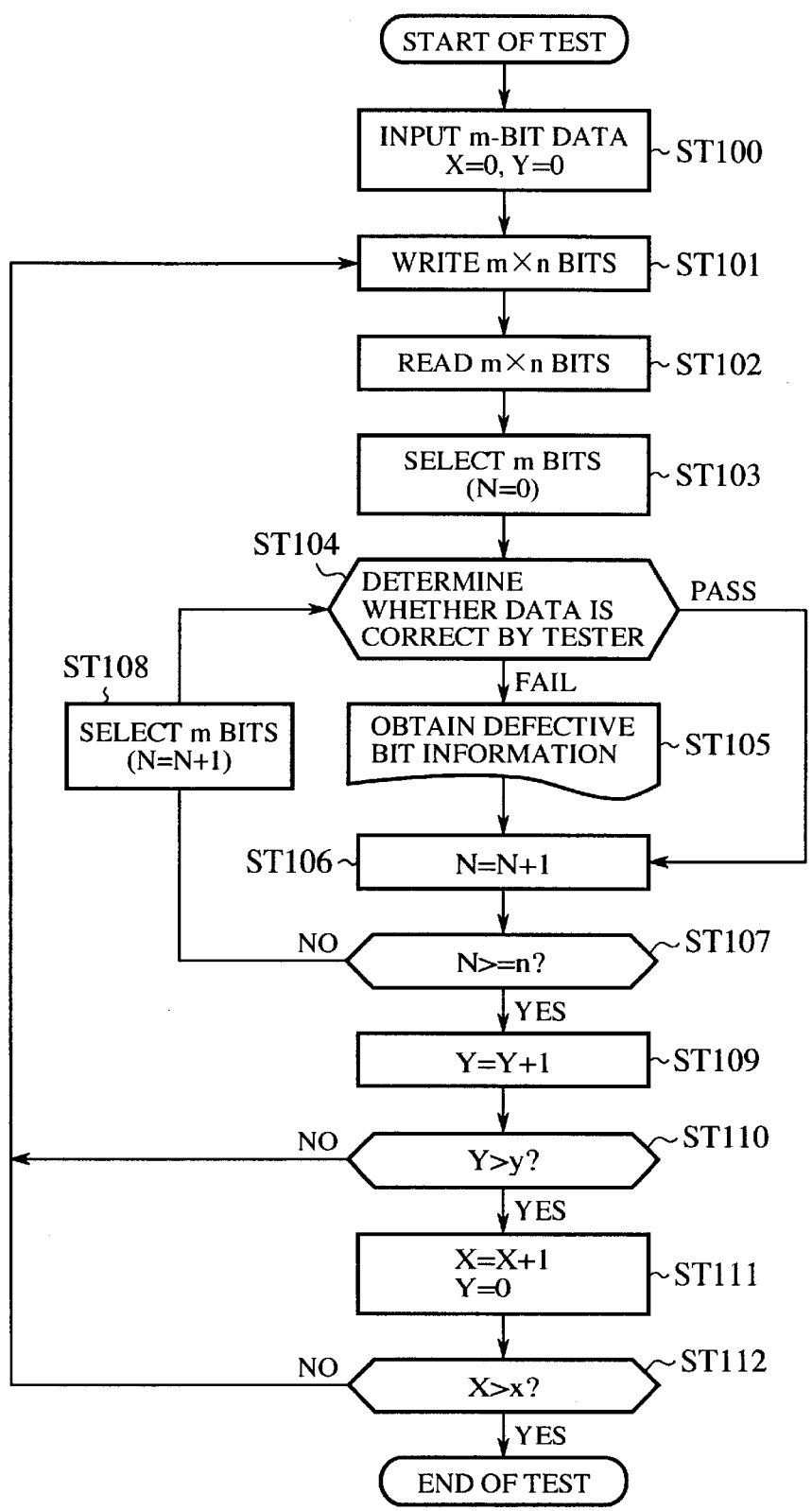
FIG. 11 is a flowchart showing the procedure of a conventional method for testing a semiconductor memory device.

Next, description will be made of a method for testing a semiconductor memory device according to the third embodiment of the present invention. FIGS. 8 and 9 are flowcharts showing the procedure of a method for testing a semiconductor memory device according to the third embodiment of the present invention.

Since steps ST70 through ST80 in FIG. 8 are the same as steps ST10 through ST20 in FIG. 2, the explanation of these components will be omitted. The flow of processes at steps ST70 through ST79 according to the third embodiment in which the determination circuit 31 determines whether (m×n)-bit data is correct includes the process at step 75 which determines whether defective bits can be corrected. This process for determining whether defective bits can be corrected may be omitted, as is the case with the first embodiment.

Steps ST81 through ST90 as described below performs a process in which if there is an address determined to be defective, (m×n)-bit data read out from the defective address is divided into pieces each having a number of bits smaller than m×n and larger than m, and the determination circuit 31 determines whether each piece of the divided data is correct to narrow down the defective bit information.

If there is an error in bits written into an address of the 16 Mbit DRAM 11 (the result is NO at step ST80), the tester sets the row address X and the column address Y based on the defective address information at step S81.

To write the data into the 16 Mbit DARM 11, the tester enters an address signal TADI indicating the row address X and the column address Y, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs a write control signal TW- having an L level, and as a result, (m×n)-bit data output from the output Q (7:0) of the D flip-flop 12 is written into a memory area (X, Y) of the 16 Mbit DRAM 11 specified by the address signal TADI through the terminal DQ (127:0) at step ST82.

To read out the data written into the 16 Mbit DRAM 11, the tester enters an address signal TADI indicating the row address X and the column address Y, and an address strobe signal TAS- having an L level to the corresponding terminals of the 16 Mbit DRAM 11. The current address signal TADI is introduced into the 16 Mbit DRAM at a timing according to the address strobe signal TAS-. With the timing of introduction of the address signal TADI into the 16 Mbit DRAM 11, the tester outputs an output control signal TOE- having an L level, and as a result, the (m×n)-bit data which has been written into the memory area (X, Y) in the 16 Mbit DRAM 11 specified by the address signal TADI and which is determined to be erroneous is read out at the same time from the terminal DQ (127:0) onto the wide data bus 15 at step ST83.

The tester sets 0 for the number K which indicates a number given to a piece of (m×n/k)-bit data obtained as a result of dividing (m×n)-bit data into k pieces. The determination circuit 31 receives (m×n)-bit data read out from the 16 Mbit DRAM 11 and the corresponding written (m×n)-bit data fed from the output Q (7:0) of the D flip-flop 12 through the data lines 17. The determination circuit 31 selects a piece of (m×n/k)-bit data indicated by the number K (=0) according to a data comparison selection signal DBS output from the tester at step ST84. Then, the determination circuit 31 compares the selected piece of (m×n/k)-bit data read out from 16 Mbit DRAM 11 with the corresponding written data output from the D flip-flop 12, and outputs a determination signal TDEC indicating the comparison result at step ST85. The determination signal TDEC is input to the tester, and if the determination signal TDEC indicates that the selected piece of (m×n/k)-bit data is erroneous, the tester performs predetermined processing.

That is, if it is determined that the selected piece of (m×n/k)-bit data is erroneous at step ST85, the tester obtains the number K (in this case, K=0) indicating the number given to the selected piece of (m×n/k)-bit data to narrow down the defective bit information at step ST86. To test the next piece of (m×n/k)-bit data, the tester increments the number K (which indicates a number given to a piece of (m×n/k)-bit data obtained as a result of dividing (m×n)-bit data into k pieces as described above) by one at step ST87, and determines whether the number K is equal to or larger than k at step ST88.

On the other hand, if it is determined that the selected piece of (m×n/k)-bit data is correct based on the determination signal TDEC at step ST85, the tester increments the number K by one in order to test the next piece of (m×n/k)-bit data, and determines whether the number K is equal to or larger than k at step ST88. If the number K is smaller than k, the determination circuit 31 selects the Kth (the updated number K) piece of (m×n/k)-bit data at step ST89, determines whether the Kth piece of (m×n/k)-bit data is correct by comparison, and outputs the comparison result as a determination signal TDEC. The tester then receives the determination signal TDEC, and narrows down the defective bit information. The above process is performed through the flow of steps ST85 to ST89. If it is determined that the number K (which indicates a number given to a piece of (m×n/k)-bit data obtained as a result of dividing (m×n)-bit data into k pieces as described above) is equal to or larger than k, the tester determines whether data in all defective addresses has been checked at step ST90.

If not all defective addresses have yet been checked, the following process is carried out at steps ST81 through ST90. The tester introduces an address signal TADI indicating a row address X and a column address Y determined to be defective based on the defective address information, into the 16 Mbit DRAM 11 according to an address strobe signal TAS-, and writes and then reads out (m×n)-bit data; the determination circuit 31 determines whether the read-out (m×n)-bit data is correct; and the tester narrows down the defective bit information, that is, obtains the number K indicating the number given to an erroneous piece of (m×n/k)-bit data if there is any.

If it is determined that all defective addresses have been checked at step ST90 in FIG. 8, the tester sets a row address X and a column address Y based on narrowed defective address information at step ST91 shown in FIG. 9. To write (m×n)-bit data into the 16 Mbit DRAM 11, the tester enters an address signal TADI indicating the row address X and the column address Y, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs a write control signal TW- having an L level, and as a result, (m×n)-bit data output from the output Q (7:0) of the D flip-flop 12 is written into a memory area (X, Y) of the 16 Mbit DRAM 11 specified by the address signal TADI through the terminal DQ (127:0) at step ST92.

To read out the data written into the 16 Mbit DRAM 11, the tester enters an address signal TADI indicating the row address X and the column address Y, and an address strobe signal TAS- having an L level to the corresponding terminals of the 16 Mbit DRAM 11. The current address signal TADI is introduced into the 16 Mbit DRAM 11 at a timing according to the address strobe signal TAS-. With the timing of introduction of the address signal TADI into the 16 Mbit DRAM 11, the tester outputs an output control signal TOE- having an L level, and as a result, the (m×n)-bit data which has been written into the memory area (X, Y) in the 16 Mbit DRAM 11 specified by the address signal TADI and which is determined to be erroneous is read out at the same time from the terminal DQ (127:0) onto the wide data bus 15 at step ST93.

The tester determines the number N which indicates the number given to a set of m bits to be tested which is selected from among m×n bits based on narrowed defective bit information, that is, the number K, which indicates a number given to a piece of (m×n/k)-bit data obtained as a result of dividing (m×n)-bit data into k pieces, at step ST94. The multiplexer 13 selects the set of m bits indicated by the number N according to an output data selection signal TSEL which is output from the tester and corresponds to the number N, and outputs the selected set of m bits as output data TDO. The tester receives the m-bit output data TDO, and compares it with its expected value at step ST95. If it is determined from the comparison result that the output data is erroneous, the tester obtains the defective bit information, that is, the, number N at step ST96, and determines whether the defective bits can be corrected at step ST97.

The determination of whether the defective bits can be corrected is made in the same way as it is made at the above step ST27. If it is determined from the comparison of the m-bit output data with its expected value that the data is correct at step ST95, or it is determined that the defective bits can be corrected at step ST97, the tester determines whether all the steps ST94 through ST97 have been performed for all the sets of m bits each corresponding to each number N at step ST98. If it is determined that the defective bits cannot be corrected at step ST97, the tester terminates the testing of this 16 Mbit DRAM 11.

If it is determined that all the sets of m bits each corresponding to each number N have been checked for correctness at step ST98, the tester determines whether data in all defective addresses has been checked for correctness at step ST99. If not all the sets of m bits each corresponding to each number N have yet been checked for correctness at step ST98, the tester determines the number N which indicates the number given to the next set of m bits to be tested which is selected from among the m×n bits based on the narrowed defective bit information, that is, the number K, which indicates a number given to a piece of (m×n/k)-bit data obtained as a result of dividing (m×n)-bit data into k pieces, compares the set of m bits (the next set of m bits) indicated by the number N with its expected value, obtains the defective bit information if the set of m bits is erroneous, and so on at steps ST94 through ST97.

If it is determined that data in all the defective addresses has been checked for correctness at step ST99, the tester ends the testing of the 16 Mbit DRAM 11. If it is determined that data in all the defective addresses has not yet been checked for correctness, on the other hand, the tester determines the row address X and the column address Y based on the narrowed defective address information, and the number N which indicates the number given to a set of m bits to be tested, compares the set of m bits with its expected value, obtains the defective bit information if the set of m bits is erroneous, and so on at steps ST91 through ST99.

Incidentally, in the above descriptions of the third embodiment of the present invention, the determination circuit 31 checks data in all addresses of the 16 Mbit DRAM 11 for correctness in units of m×n bits by incrementing or decrementing the column address Y one by one for each column, to perform the test. However, the row address X and the column address Y may be incremented or decremented at the same time one by one with the same effect as that obtained in the second embodiment.

It should be noted that the row address X may be singly incremented or decremented one by one for each row, producing the same effect as that obtained in the first embodiment.

As described above, to determine whether the 16 Mbit DRAM 11 is defective, the third embodiment adds to the first embodiment a process in which the determination circuit 31 checks data in all addresses of the 16 Mbit DRAM 11 for correctness in units of m×n bits, and if there is an address determined to be defective, the determination circuit 31 checks data in the defective address in units of a number of bits smaller than m×n and larger than m at steps ST81 through ST90 in FIG. 8. With this arrangement, it is possible to obtain the number K which indicates the number given to a piece of (m×n/k)-bit data to be tested in units of m bits, at steps ST85 and ST86. Thus, it is only necessary to test sets of m bits each indicated by each number N included in defective bit information indicated by each number K, making it possible to reduce the number of tests to be performed to a number smaller than n for each (m×n)-bit data.

As described heretofore, according to one aspect of the present invention, a method for testing a semiconductor memory device tests a semiconductor memory device having a wide data bus of an (m×n)-bit width and includes a first process and a second process, wherein the first process comprises the steps of: reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address; and ending testing of the semiconductor memory device if it is determined that the read-out (m×n)-bit data from all addresses of the semiconductor memory device is correct; whereas the second process comprises the steps of: writing (m×n)-bit data into the obtained defective address and then reading out the written (m×n)-bit data; and comparing each m-bit data constituting the read-out (m×n)-bit data with an expected value of a predetermined m-bit data to determine whether the each m-bit data constituting the read-out (m×n)-bit data is correct. Accordingly, for a semiconductor memory device whose data is determined to be correct in all of its addresses, it is not necessary to compare each m-bit data with its expected value and determine whether defective bits can be corrected, and if a defective address has been found, it is only necessary to test data in the defective address alone in units of m bits, making it possible to considerably reduce man hours required for testing a semiconductor memory device.

According to another aspect of the present invention, a method for testing a semiconductor memory device tests a semiconductor memory device having a wide data bus of an (m×n)-bit width and includes a first process and a second process, wherein the first process comprises the steps of: reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address; and ending testing of the semiconductor memory device if it is determined that the read-out (m×n)-bit data from all addresses of the semiconductor memory device is correct; whereas the second process comprising the steps of: writing (m×n)-bit data into the obtained defective address and then reading out the written (m×n)-bit data; dividing the read-out (m×n)-bit data into pieces each having a number of bits smaller than m×n and larger than m; comparing each piece of the divided read-out data having said number of bits with a corresponding piece of data obtained as a result of dividing the (m×n)-bit data of its before-written state into pieces each having said number of bits to determine whether the each piece of the divided read-out data is correct; and comparing each m-bit data constituting an erroneous piece of the divided read-out data having said number of bits with an expected value of a predetermined m-bit data to determine whether the each m-bit data constituting the erroneous piece of the divided read-out data is correct. Accordingly, since the number given to each piece of data obtained as a result of dividing m×n-bit data into pieces can be acquired, it is possible to narrow down possible erroneous pieces of m-bit data and reduce the number of tests to be performed in units of m bits for one address of a semiconductor memory device to a number smaller than n, further reducing man hours required for testing a semiconductor memory device.

According to still another aspect of the present invention, in the above method for testing a semiconductor memory device, wherein the first process specifies each address of the semiconductor memory device by increasing or decreasing a row address of the semiconductor memory device by one address at a time for each row, or by increasing or decreasing a column address of the semiconductor memory device by one address at a time for each column in order to test the semiconductor memory device. Accordingly, since addresses are checked for correctness sequentially in one direction, it is possible to find a linear fault mode in memory cells.

According to yet another aspect of the present invention, the above method for testing a semiconductor memory device further includes a third process employed before the first process, the third process comprising the steps of: specifying each address of the semiconductor memory device by increasing or decreasing both a row address and a column address of the semiconductor memory device simultaneously by one address at a time; reading out (m×n)-bit data written into each address of the semiconductor memory device; comparing the read-out (m×n)-bit data with the corresponding (m×n)-bit data of its before-written state to determine whether the read-out (m×n)-bit data is correct; obtaining, if it is determined that the read-out (m×n)-bit data is erroneous, an address corresponding to the erroneous data as a defective address and determining whether defective memory cells corresponding to the defective address can be repaired by replacing the defective memory cells with redundant memory cells held by the semiconductor memory device; and ending testing of said semiconductor memory device if it is determined that the defective memory cells cannot be repaired. Accordingly, it is possible to quickly find defective semiconductor memory devices which cannot be repaired, from among a number of semiconductor memory devices, reducing total man hours required for testing a number of semiconductor memory devices.

According to still a further aspect of the present invention, in the above method for testing a semiconductor memory device, wherein the first process further comprises a step of:

determining whether defective memory cells corresponding to the defective address can be repaired by replacing the defective memory cells with redundant memory cells held by the semiconductor memory device if it is determined that (m×n)-bit data stored in a predetermined address is erroneous. Accordingly, it is possible to repair a semiconductor memory device having some defective memory cells by replacing the defective memory cells with redundant memory cells, and use the semiconductor memory device at its rated capacity, improving the yield of the semiconductor memory device.

According to yet another aspect of the present invention, in the above method for testing a semiconductor memory device, the second process further comprises a step of: determining whether defective memory cells corresponding to the erroneous m-bit data can be repaired by replacing the defective memory cells with redundant memory cells held by the semiconductor memory device if it is determined from comparison of m-bit data with an expected value of predetermined m-bit data that the former m-bit data is erroneous. Accordingly, it is possible to repair a semiconductor memory device having some defective memory cells by replacing the defective memory cells with redundant memory cells, and use the semiconductor memory device at its rated capacity, improving the yield of the semiconductor memory device.

According to still another aspect of the present invention, in the above method for testing a semiconductor memory device, in the case where one of the first process, the second process, and the third process determines whether a semiconductor memory device which has some defective memory cells corresponding to a defective address or erroneous m-bit data can be repaired by replacing the defective memory cells with redundant memory cells held by the semiconductor memory device, if the number of the defective memory cells is smaller than the number of the redundant memory cells, it is determined that the defective semiconductor memory device can be repaired. Accordingly, it is possible to repair a semiconductor memory device having some defective memory cells by replacing the defective memory cells with redundant memory cells, and use the semiconductor memory device at its rated capacity, improving the yield of the semiconductor memory device.

What is claimed is:

1. A method for testing a semiconductor memory device, wherein said method tests a semiconductor memory device having a wide data bus of an (m×n)-bit width and includes a first process and a second process, said first process comprising the steps of:
inputting (m×n)-bit data;
writing the (m×n)-bit data into each address of the semiconductor memory device;
reading out (m×n)-bit data written into each address of said semiconductor memory device;
comparing the read-out (m×n)-bit data with the input (m×n)-bit data of its before-written state to determine whether the read-out (m×n)-bit data is correct;
obtaining, if it is determined that the read-out (m×n)-bit data is erroneous, an address corresponding to the erroneous data as a defective address; and
ending testing of the semiconductor memory device if it is determined that the read-out (m×n)-bit data from all addresses of said semiconductor memory device is correct; and said second process comprising the steps of:
writing (m×n)-bit data into said obtained defective address and then reading out the written (m×n)-bit data; and
comparing each m-bit data constituting the read-out (m×n)-bit data with an expected value of a predetermined m-bit data to determine whether the each m-bit data constituting the read-out (m×n)-bit data is correct.

2. A method for testing a semiconductor memory device, wherein said method tests a semiconductor memory device having a wide data bus of an (m×n)-bit width and includes a first process and a second process, said first process comprising the steps of:
inputting (m×n)-bit data;
writing the (m×n)-bit data into each address of the semiconductor memory device;
reading out (m×n)-bit data written into each address of said semiconductor memory device;
comparing the read-out (m×n)-bit data with the input (m×n)-bit data of its before-written state to determine whether the read-out (m×n)-bit data is correct;
obtaining, if it is determined that the read-out (m×n)-bit data is erroneous, an address corresponding to the erroneous data as a defective address; and
ending testing of the semiconductor memory device if it is determined that the read-out (m×n)-bit data from all addresses of said semiconductor memory device is correct; and said second process comprising the steps of:
writing (m×n)-bit data into said obtained defective address and then reading out the written (m×n)-bit data;
dividing the read-out (m×n)-bit data into pieces each having a number of bits smaller than m×n and larger than m;
comparing each piece of the divided read-out data having said number of bits with a corresponding piece of data obtained as a result of dividing said (m×n)-bit data of its before-written state into pieces each having said number of bits to determine whether the each piece of the divided read-out data is correct; and
comparing each m-bit data constituting an erroneous piece of the divided read-out data having said number of bits with an expected value of a predetermined m-bit data to determine whether the each m-bit data constituting the erroneous piece of the divided read-out data is correct.

3. The method for testing a semiconductor memory device according to claim 1, wherein the first process specifies each address of the semiconductor memory device by increasing or decreasing a row address of the semiconductor memory device by one address at a time for each row, or by increasing or decreasing a column address of the semiconductor memory device by one address at a time for each column in order to test the semiconductor memory device.

4. The method for testing a semiconductor memory device according to claim 1, wherein said method further includes a third process employed before the first process, said third process comprising the steps of:
specifying each address of the semiconductor memory device by increasing or decreasing both a row address and a column address of the semiconductor memory device simultaneously by one address at a time;
reading out (m×n)-bit data written into each address of said semiconductor memory device;
comparing the read-out (m×n)-bit data with the corresponding (m×n)-bit data of its before-written state to determine whether the read-out (m×n)-bit data is correct;

obtaining, if it is determined that the read-out (m×n)-bit data is erroneous, an address corresponding to the erroneous data as a defective address and determining whether defective memory cells corresponding to the defective address are repairable by replacing the defective memory cells with redundant memory cells held by the semiconductor memory device; and ending testing of said semiconductor memory device if it is determined that the defective memory cells are not repairable.

5. The method for testing a semiconductor memory device according to claim 1, wherein the first process further comprises a step of:

determining whether defective memory cells corresponding to the defective address are repairable by replacing the defective memory cells with redundant memory cells held by the semiconductor memory device, if it is determined that (m×n)-bit data stored in a predetermined address is erroneous.

6. The method for testing a semiconductor memory device according to claim 1, wherein the second process further comprises a step of:

if it is determined from comparison of m-bit data with an expected value of a predetermined m-bit data that the former m-bit data is erroneous, determining whether defective memory cells corresponding to the erroneous m-bit data are repairable by replacing the defective memory cells with redundant memory cells held by the semiconductor memory device.

7. The method for testing a semiconductor memory device according to claim 4, wherein in the case where one of the first process, the second process, and the third process determines whether a semiconductor memory device which has some defective memory cells corresponding to a defective address or erroneous m-bit data is repairable by replacing the defective memory cells with redundant memory cells held by the semiconductor memory device, if the number of the defective memory cells is smaller than the number of the redundant memory cells, it is determined that the defective semiconductor memory device is repairable.

8. The method for testing a semiconductor memory device according to claim 2, wherein the first process specifies each address of the semiconductor memory device by increasing or decreasing a row address of the semiconductor memory device by one address at a time for each row, or by increasing or decreasing a column address of the semiconductor memory device by one address at a time for each column in order to test the semiconductor memory device.

9. The method for testing a semiconductor memory device according to claim 2, wherein said method further includes a third process employed before the first process, said third process comprising the steps of:

specifying each address of the semiconductor memory device by increasing or decreasing both a row address and a column address of the semiconductor memory device simultaneously by one address at a time;

reading out (m×n)-bit data written into each address of said semiconductor memory device;

comparing the read-out (m×n)-bit data with the corresponding (m×n)-bit data of its before-written state to determine whether the read-out (m×n)-bit data is correct;

obtaining, if it is determined that the read-out (m×n)-bit data is erroneous, an address corresponding to the erroneous data as a defective address and determining whether defective memory cells corresponding to the defective address are repairable by replacing the defective memory cells with redundant memory cells held by the semiconductor memory device; and ending testing of said semiconductor memory device if it is determined that the defective memory cells are not repairable.

10. The method for testing a semiconductor memory device according to claim 2, wherein the first process further comprises a step of:

determining whether defective memory cells corresponding to the defective address are repairable by replacing the defective memory cells with redundant memory cells held by the semiconductor memory device, if it is determined that (m×n)-bit data stored in a predetermined address is erroneous.

11. The method for testing a semiconductor memory device according to claim 2, wherein the second process further comprises a step of:

if it is determined from comparison of m-bit data with an expected value of a predetermined m-bit data that the former m-bit data is erroneous, determining whether defective memory cells corresponding to the erroneous m-bit data are repairable by replacing the defective memory cells with redundant memory cells held by the semiconductor memory device.

12. The method for testing a semiconductor memory device according to claim 9, wherein in the case where one of the first process, the second process, and the third process determines whether a semiconductor memory device which has some defective memory cells corresponding to a defective address or erroneous m-bit data is repairable by replacing the defective memory cells with redundant memory cells held by the semiconductor memory device, if the number of the defective memory cells is smaller than the number of the redundant memory cells, it is determined that the defective semiconductor memory device is repairable.

* * * * *